(12) United States Patent
Nishizawa et al.

(10) Patent No.: US 9,354,060 B2
(45) Date of Patent: May 31, 2016

(54) VIBRATING ELEMENT, GYRO SENSOR, ELECTRONIC APPARATUS AND MOVING OBJECT

(71) Applicant: Seiko Epson Corporation, Tokyo (JP)

(72) Inventors: Ryuta Nishizawa, Matsumoto (JP); Keiji Nakagawa, Kamiina (JP); Takayuki Kikuchi, Okaya (JP)

(73) Assignee: Seiko Epson Corporation (JP)

( * ) Notice: Subject to any disclaimer, the term of this patent is extended or adjusted under 35 U.S.C. 154(b) by 614 days.

(21) Appl. No.: 13/850,537

(22) Filed: Mar. 26, 2013

(65) Prior Publication Data

US 2013/0291638 A1 Nov. 7, 2013

(30) Foreign Application Priority Data

Mar. 28, 2012 (JP) ................. 2012-074794

(51) Int. Cl.

| | |
|---|---|
| *G01C 19/00* | (2013.01) |
| *G01P 3/44* | (2006.01) |
| *G01P 15/08* | (2006.01) |
| *G01C 19/5607* | (2012.01) |
| *H01L 41/08* | (2006.01) |
| *H01L 41/09* | (2006.01) |
| *H01L 41/113* | (2006.01) |
| *G01C 19/5621* | (2012.01) |

(52) U.S. Cl.
CPC ........ *G01C 19/5607* (2013.01); *G01C 19/5621* (2013.01); *H01L 41/08* (2013.01); *H01L 41/0825* (2013.01); *H01L 41/094* (2013.01); *H01L 41/1132* (2013.01); *H01L 41/1136* (2013.01)

(58) Field of Classification Search
CPC ........... G01C 19/5607; G01C 19/5628; G01C 19/5656; H01L 41/094; H01L 41/0966; H01L 41/1136

USPC ............... 73/504.12, 504.16; 310/321
See application file for complete search history.

(56) References Cited

U.S. PATENT DOCUMENTS

| | | | |
|---|---|---|---|
| 6,101,878 A | 8/2000 | Watarai | |
| 6,223,597 B1 | 5/2001 | Watarai | |
| 6,806,797 B2 | 10/2004 | Kikushima | |
| 6,889,550 B2 * | 5/2005 | Beitia | ................. 73/504.12 |

(Continued)

FOREIGN PATENT DOCUMENTS

| | | | | |
|---|---|---|---|---|
| DE | 69614340 T2 * | 9/2001 | ............. | G01C 19/56 |
| JP | 07-280572 | 10/1995 | | |

(Continued)

OTHER PUBLICATIONS

Machine translation of German patent document's Description of DE 69614340, Date of patent document publication: Sep. 2001, Publisher: European Patent Office, pp. 1-8.*

*Primary Examiner* — Lisa Caputo
*Assistant Examiner* — Roger Hernandez-Prewitt
(74) *Attorney, Agent, or Firm* — Harness, Dickey & Pierce, P.L.C.

(57) ABSTRACT

A vibrating element includes first and second pairs of vibrating arms extending in opposite directions from a base. A pair of first suspension arms extends from the base via first connecting parts and are connected to a fixed portion attached to a container for the vibrating element so that the base, the pair of first suspension arms and the fixed portion surround the pair of first vibrating arms. A pair of second suspension arms extends from the base via second connecting parts and are connected to the fixed portion so that the pair of second suspension arms is located outside of the pair of first vibrating arms and the pair of first suspension arms.

10 Claims, 17 Drawing Sheets

(56) References Cited

U.S. PATENT DOCUMENTS

| | | |
|---|---|---|
| 7,365,478 B2 * | 4/2008 | Kawashima ............... 310/370 |
| 2001/0010169 A1 | 8/2001 | Watarai |
| 2006/0053883 A1 * | 3/2006 | Hayashi ............ G01C 19/5628 73/504.12 |

FOREIGN PATENT DOCUMENTS

| JP | 2518600 | 5/1996 |
|---|---|---|
| JP | 10-170274 | 6/1998 |
| JP | 10-325728 A | 12/1998 |
| JP | 11-063999 A | 3/1999 |
| JP | 3368723 | 11/2002 |
| JP | 2004-007428 | 1/2004 |
| JP | 2004-251663 | 9/2004 |
| JP | 3674013 | 5/2005 |
| JP | 3752737 | 12/2005 |
| JP | 4147784 | 7/2008 |
| JP | 2008-267983 | 11/2008 |
| JP | 2009-236552 A | 10/2009 |
| JP | 2011-075415 | 4/2011 |

\* cited by examiner

VIBRATING ELEMENT, GYRO SENSOR, ELECTRONIC APPARATUS AND MOVING OBJECT

BACKGROUND

1. Technical Field

The present invention relates to a vibrating element, a gyro sensor utilizing the vibrating element, an electronic apparatus and moving object or the like having the vibrating element incorporated therein.

2. Related Art

A vibrating element utilized in a gyro sensor is generally known. For example, in the vibrating element described in JP-A-2011-75415 and JP-A-2004-251663, a pair of first vibrating arms extend in a first direction from a base portion, and a pair of second vibrating arms extend in a second direction opposite to the first direction, from the base portion. For example, vibration is excited by the pair of first vibrating arms. At this point, if angular velocity motion is applied to the vibrating element, a Coriolis force acts to change the direction of vibration of the first vibrating arms. A new force component is generated in a specific direction corresponding to the Coriolis force. This force component causes motion of the second vibrating arms. Thus, the force component corresponding to the angular velocity is detected, based on the motion of the second vibrating arms.

The base portion is supported by a pair of suspension arms penetrating the center of gravity of the base portion (vibration stationary point). When the Coriolis force is applied, the second vibrating arms vibrate around the center of gravity of the base portion (vibration stationary point). However, with the base portion supported simply by the pair of suspension arms, maximum motion of the second vibrating arms cannot be generated. Also, both a wire of a drive system and a wire of a detection system are laid in the pair of suspension arms and therefore large electrostatic coupling between the two wires is generated. This causes an unwanted signal and deteriorates noise characteristics and temperature characteristics of the vibrating element.

SUMMARY

An advantage of some aspects of the invention is to solve at least a part of the problems described above, and the invention can be implemented as the following forms or application examples.

(1) An aspect of the invention relates to a vibrating element including: a base portion; a first vibrating arm extending along a first direction from the base portion; a second vibrating arm extending along a second direction opposite to the first direction, from the base portion; a fixed portion which holds the base portion; a first suspension arm extending from the fixed portion and connected to a first connecting part of the base portion; and a pair of second suspension arms extending from the fixed portion, on both sides of the first suspension arm, and connected to a second connecting part of the base portion. One of the first vibrating arm and the second vibrating arm is a vibrating arm for driving, and the other is a vibrating arm for detection. The expression "on both sides of . . . " here includes a configuration in which a certain object is arranged between two other objects and spaced apart from each of these two other objects. The first suspension arm may be arranged in a space between the pair of second suspension arms. This also applies the following description.

This vibrating element can be used to detect angular velocity. In detecting angular velocity, vibration is excited by the vibrating arm for driving. At this point, if angular velocity motion is applied to the vibrating element, a Coriolis force acts to change the direction of vibration of the vibrating arm for driving. A new force component is generated in a specific direction corresponding to the Coriolis force. This force component causes motion of the vibrating arm for detection. Thus, the force component corresponding to the angular velocity is detected based on the motion of the vibrating arm for detection. According to a verification by the inventor, since the base portion of this vibrating element is supported at least by three suspension arms, the motion of the vibrating arm for detection is amplified, compared with the case where the base portion is supported by a pair of suspension arms penetrating the center of gravity of the base portion. Therefore, detection accuracy can be enhanced.

(2) The fixed portion may be situated at least further toward the first direction than the first vibrating arm, and the second connecting part may be situated further toward the second direction than the first connecting part. With this configuration, the base portion can be supported more firmly in a cantilevered form.

(3) The vibrating element may include a first wire which is arranged in the first suspension arm and connected to a first electrode provided on the first vibrating arm, and a second wire which is arranged in the second suspension arm and connected to a second electrode provided on the second vibrating arm.

In this vibrating element, the first wire and the second wire can be spaced apart from each other. The first wire and the second wire can be separated from each other by the space. Consequently, electrostatic coupling between the first wire and the second wire can be reduced significantly, compared with the case where the wire connected to the electrode fixed to the vibrating arm for driving and the wire connected to the electrode fixed to the vibrating arm for detection are both arranged on the single suspension arm. Such a reduction in electrostatic coupling can contribute to improvement in S/N ratio.

(4) The fixed portion may include a first fixed piece on which a first electrically conductive terminal connected to the first wire is provided and which is connected to the first suspension arm, and second fixed pieces on which a second electrically conductive terminal connected to the second wire is provided and which extend from the first fixed piece, on both sides of the first suspension arm, and are connected to the respective second suspension arms.

In this vibrating element, the second electrically conductive terminal, too, can be spaced apart from the first electrically conductive terminal. The fixed portion can be prevented from expanding even when the second electrically conductive terminal is arranged away from the first electrically conductive terminal. Thus, an increase in the overall size of the vibrating element can be avoided. A number of conductive terminals can be arranged on the fixed portion without increasing the size.

(5) The second fixed piece may have a greater width than a width of the second suspension arm. The rigidity of the second fixed piece can be increased.

(6) A conductive terminal for grounding may be arranged between the first electrically conductive terminal and the second electrically conductive terminal. The conductive terminal for grounding plays a shielding role between the first electrically conductive terminal and the second electrically conductive terminal. Therefore, electrostatic coupling between the first electrically conductive terminal and the second electrically conductive terminal can be avoided securely.

(7) The first suspension arm may be a pair of first suspension arms each of which extends from the fixed portion and which are connected to two units of the first connecting part, respectively. With such a configuration, the base portion is supported by the four suspension arms and therefore the strength against shock of the vibrating element can be increased. Moreover, the first wire can be allocated to each of the first suspension arms and the degree of freedom in wiring can be increased.

(8) The first suspension arm may be a single first suspension arm extending from the fixed portion and connected to a single unit of the first connecting part. With such a configuration, the structure of the vibrating element can be simplified. Moreover, the first suspension arm can be spaced apart to the maximum degree from the pair of second suspension arms. The first suspension arm and the second suspension arms can be separated away from each other by the maximum space. Therefore, electrostatic coupling between the first wire and the second wire can be reduced to the maximum extent.

(9) In the vibrating element, at least one of the first suspension arm and the second suspension arms may have at least two flexure parts between the fixed portion and the base portion. With the flexure parts, the total length of the first suspension arm and the second suspension arms can be increased without increasing the size of the vibrating element. As the total length is thus increased, the support rigidity of the base portion is decreased. Consequently, transmission of vibration from outside can be decreased and vibration resistance and shock resistance can be enhanced.

(10) The vibrating element may be incorporated in a gyro sensor for use. The gyro sensor may include the vibrating element.

(11) The vibrating element may be used by being incorporated in an electronic apparatus. The electronic apparatus can include the vibrating element.

(12) The vibrating element may be used by being incorporated in a moving object. The moving object can include the vibrating element.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an embodiment of the invention will be described with reference to the accompanying drawings. The following embodiments are not to unduly limit the contents of the invention described in the appended claims. Not all the configurations described in the embodiments are essential as measures for resolution according to the invention.

1. Configuration of Gyro Sensor According to First Embodiment

Figure 1:
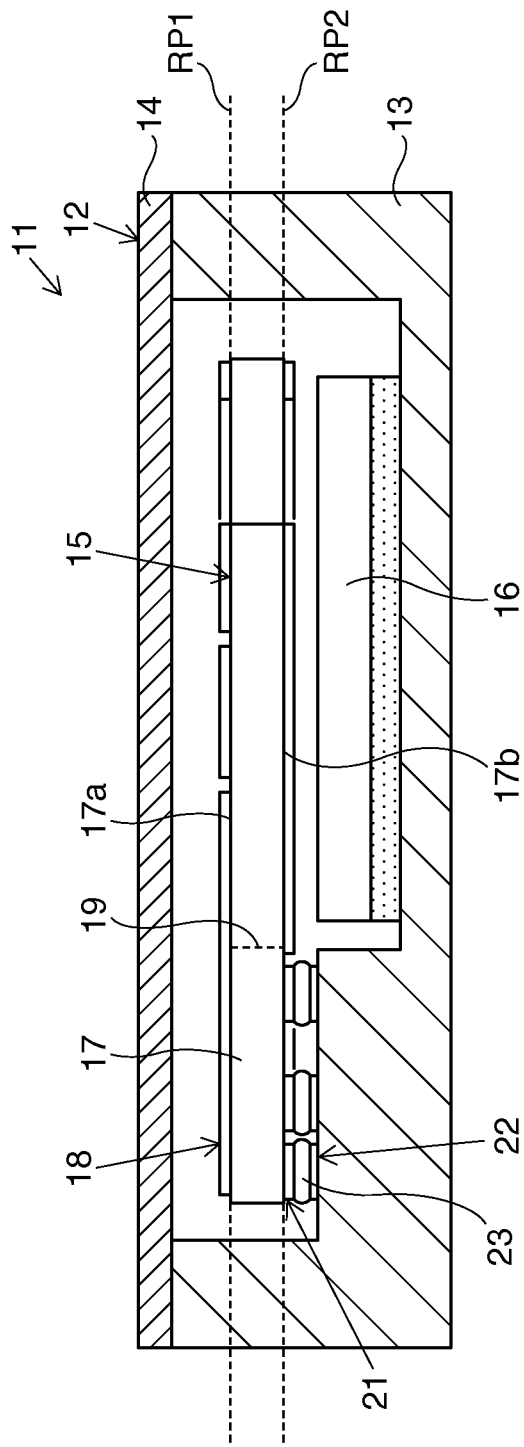
FIG. 1 is a vertical sectional view schematically showing the configuration of a gyro sensor according to a first embodiment.

FIG. 1 schematically shows the configuration of a gyro sensor 11 according to a first embodiment. The gyro sensor 11 has a container 12, for example, in the shape of a box. The container 12 includes a container main body 13 and a lid member 14. An opening of the container main body 13 is covered by the lid member 14 in an air tight manner. The inner space of the container 12 can be sealed, for example, in a vacuum. The container 12 functions as a rigid body. At least the lid member 14 can be made of a conductor. When the lid member 14 is grounded, the lid member 14 can exert a shielding effect against electromagnetic waves.

A vibrating element 15 and an IC (integrated circuit) chip 16 are housed in the container 12. The vibrating element 15 and the IC chip 16 are arranged within the inner space of the container 12. The vibrating element 15 includes a main body 17 and an electrically conductive film 18. The electrically conductive film 18 is stacked on the surfaces of the main body 17. The electrically conductive film 18 can be made of an electrically conductive material such as gold (Au), copper (Cu) or other metals. The electrically conductive film 18 can be formed as a thin film or thick film. As is clear from FIG. 1, the main body 17 of the vibrating element 15 has a face side 17a and a back side 17b. The face side 17a spreads within a first reference plane RP1. The back side 17b spreads within a second reference plane RP2. The second reference plane RP2 spreads parallel to the first reference plane RP1. Here, the entire main body 17 is formed by a single piezoelectric body. For example, a crystal can be used as the piezoelectric body.

The vibrating element 15 is supported in a cantilevered form on the container main body 13. In the cantilever support, a fixed portion 19 is marked off at one end of the main body 17. A connection terminal group 21 is arranged on the fixed portion 19. The connection terminal group 21 is formed by a portion of the electrically conductive film 18 spreading on the back side 17b. The connection terminal group 21 includes plural connection terminals, that is, pads made of an electrically conductive material. Details of the connection terminals will be described later. Meanwhile, an electrically conductive terminal group 22 is arranged on a bottom plate of the container main body 13. The electrically conductive terminal group 22 includes plural connection terminals, that is, pads made of an electrically conductive material. The connection terminal group 21 of the vibrating element 15 is joined with the electrically conductive terminal group 22 on the bottom plate. In the joining, an electrically conductive joining material 23, for example, solder bumps or gold bumps, can be used. The vibrating element 15 is thus fixed at the fixed portion 19 to the bottom plate of the container main body 13. The electrically conductive terminal group 22 is connected to the IC chip 16 by wires (not shown) of the electrically conductive film 18. The IC chip 16 can be adhered, for example, to the bottom plate of the container main body 13.

Figure 2:
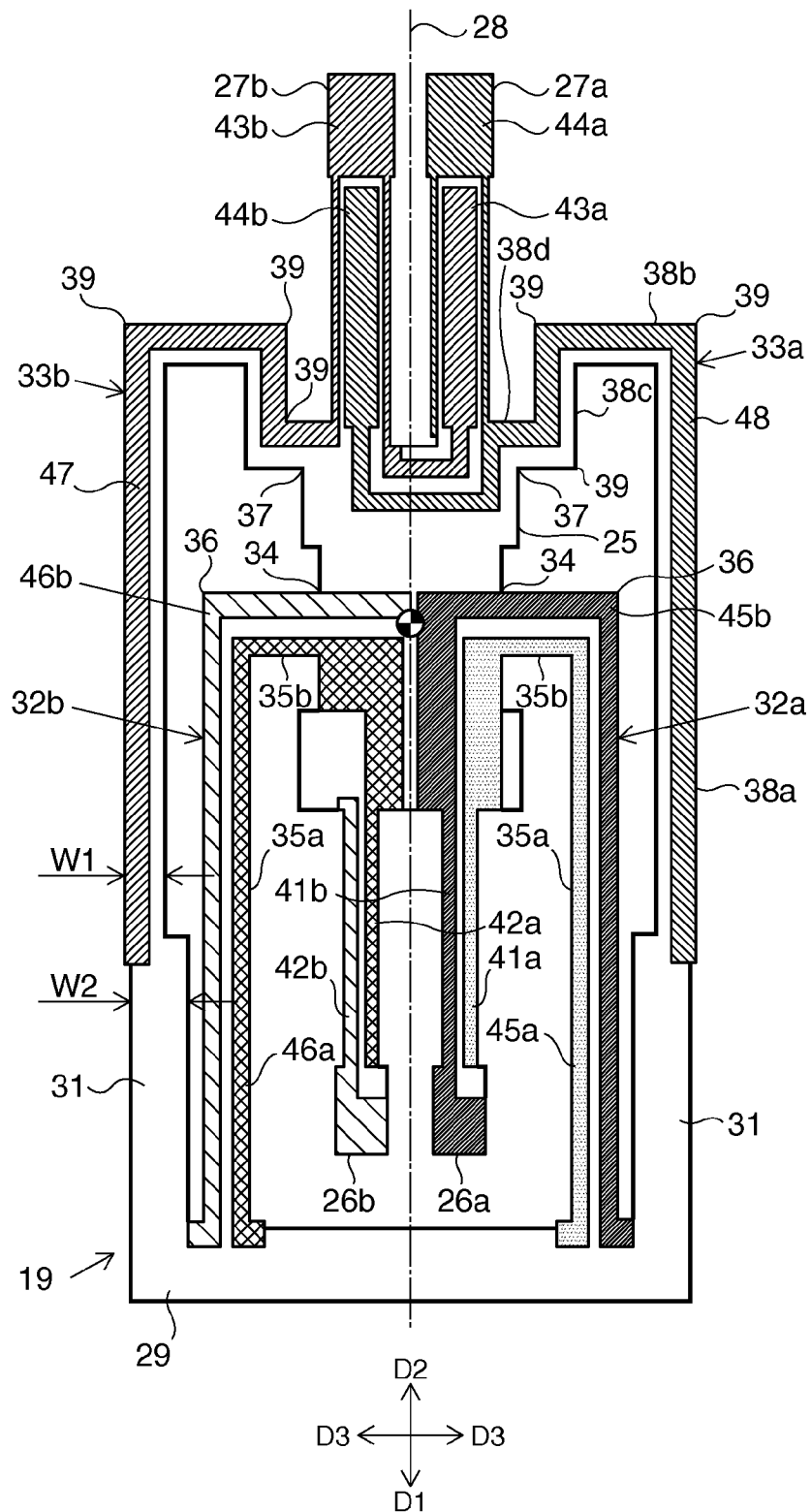
FIG. 2 is an enlarged plan view schematically showing the configuration of a face side of a vibrating element.

As shown in FIG. 2, the main body 17 of the vibrating element 15 has a base portion 25, a pair of first vibrating arms 26a, 26b, and a pair of second vibrating arms 27a, 27b. The pair of first vibrating arms 26a, 26b extend in a first direction D1 from the base portion 25. The first vibrating arms 26a, 26b are supported in a cantilevered form on the base portion 25. The first vibrating arms 26a, 26b extend parallel to each other. The first vibrating arms 26a, 26b are formed with plane symmetry about a symmetry plane 28 which includes the center of gravity of the base portion 25 and is orthogonal to the first and second reference planes RP1, RP2. Here, the pair of first vibrating arms 26a, 26b function as a pair of vibrating arms for detection. The base portion 25 has predetermined rigidity.

The pair of second vibrating arms 27a, 27b extend in a second direction D2 from the base portion 25. The second direction D2 is equivalent to the direction opposite to the first direction D1. The second vibrating arms 27a, 27b are supported in a cantilevered form on the base portion 25. The second vibrating arms 27a, 27b extend parallel to each other. The second vibrating arms 27a, 27b are formed with plane symmetry about the symmetry plane 28 including the center of gravity of the base portion 25 and orthogonal to the first and second reference planes RP1, RP2. Here, the pair of second vibrating arms 27a, 27b function as a pair of vibrating arms for driving.

The fixed portion 19 is situated at least further toward the first direction D1 than the first vibrating arms 26a, 26b. The fixed portion 19 has a first fixed piece 29 and a pair of second fixed pieces 31. The first fixed piece 29 extends in a third direction D3 which is orthogonal to the above symmetry plane 28 and which extends away from the symmetry plane 28. The second fixed pieces 31 are connected to both ends of the first fixed piece 29, respectively. Each of the second fixed pieces 31 extends in the second direction D2. The fixed portion 19 has a predetermined rigidity. The fixed portion 19 functions as a rigid body.

The main body 17 of the vibrating element 15 has at least one first suspension arm 32a, 32b and a pair of second suspension arms 33a, 33b. Here, a pair of first suspension arms 32a, 32b are marked off in the main body 17. The first suspension arms 32a, 32b extend respectively on both sides of the pair of first vibrating arms 26a, 26b from the first fixed piece 29 of the fixed portion 19. The distal ends of the first suspension arms 32a, 32b are connected respectively to first connecting parts 34 of the base portion 25. The two first connecting parts 34 are situated on both sides of the pair of first vibrating arms 26a, 26b. Here, each of the individual first suspension arms 32a, 32b includes a first straight arm 35a and a second straight arm 35b. The first straight arm 35a linearly extends in the second direction D2 from the first fixed piece 29. The second straight arm 35b extends in the third direction D3 from the first connecting part 34. The distal end of the second straight arm 35b is connected to the distal end of the first straight arm 35a. Thus, one flexure part 36 is formed in the respective first suspension arms 32a, 32b. Here, the second straight arm 35b can extend on one straight line which passes through the center of gravity of the base portion 25. The bend part 36 may be formed by bending or curving.

The second suspension arms 33a, 33b extend respectively on both sides of the pair of first suspension arms 32a, 33b from the second fixed pieces 31 of the fixed portion 19. The distal ends of the second suspension arms 33a, 33b are connected to second connecting parts 37 of the base portion 25. The second connecting parts 37 are situated further toward the second direction D2 than the first connecting parts 34. Here, each of the second suspension arms 33a, 33b includes a third straight arm 38a, a fourth straight arm 38b, a fifth straight arm 38c and a sixth straight arm 38d. The third straight arm 38a linearly extends in the second direction D2 from the second fixed piece 31. The sixth straight arm 38d extends in the third direction D3 from the second connecting part 37. The fifth straight arm 38c extends in the second direction D2 from the distal end of the sixth straight arm 38d. The fourth straight arm 38b extends in the direction D3 from the distal end of the fifth straight arm 38c. The distal end of the fourth straight arm 38b is connected to the distal end of the third straight arm 38a. Thus, three flexure parts 39 are formed in the respective second suspension arms 33a, 33b. The flexure parts 39 may be formed by bending or curving.

The second suspension arms 33a, 33b have a width W1 that is smaller than a width W2 of the second fixed pieces 31. The widths W1, W2 are specified, for example, within the first reference plane RP1, in a direction orthogonal to the longitudinal direction of the second suspension arms 33a, 33b and the second fixed pieces 31. Thus, the rigidity of the second fixed pieces 31 is made higher than the rigidity of the second suspension arms 33a, 33b. Here, since the second fixed pieces 31, the third straight arms 38a and the fifth straight arms 38c extend parallel to the symmetry plane 28, the widths W2, W1 thereof can be measured in the third direction D3 within the first reference plane RP1. Since the fourth straight arms 38b and the sixth straight arms 38d extend in the direction orthogonal to the symmetry plane 28, the width W1 thereof can be measured in the first direction D1 (or the second direction D2) within the first reference plane RP1. In the case where the thickness of the main body 17 is not uniform, as in this embodiment, the size of a cross section orthogonal to the longitudinal direction can be considered in the second suspension arms 33a, 33b and the second fixed pieces 31, in order to adjust rigidity.

The electrically conductive film 18 forms two pairs of first detection electrodes (first electrodes) 41a, 41b and two pairs of second detection electrodes (first electrodes) 42a, 42b. The first detection electrodes 41a, 41b are fixed to one first vibrating arm 26a. Signal electrodes 41a of the first detection electrodes extend from the base of the first vibrating arm 26a toward the distal end thereof, on a face side and a back side of the first vibrating arm 26a. The signal electrodes 41a are connected to each other at the base portion 25. Ground electrodes 41b of the first detection electrodes extend across the total length of the first vibrating arm 26a, on the face side and the back side of the first vibrating arm 26a. The ground electrodes 41b are connected to each other at the distal end of the first vibrating arm 26a. The first vibrating arm 26a is located between the signal electrodes 41a and the ground electrodes 41b. A current is taken out from the signal electrodes 41a and the ground electrodes 41b in accordance with the deformation of the one first vibrating arm 26a.

The second detection electrodes 42a, 42b are fixed to the other first vibrating arm 26b. Signal electrodes 42a of the second detection electrodes extend from the base of the first vibrating arm 26b toward the distal end thereof, on a face side and a back side of the first vibrating arm 26b. The signal electrodes 42a are connected to each other at the base portion 25. Ground electrodes 42b of the second detection electrodes extend across the total length of the first vibrating arm 26b, on the face side and the back side of the first vibrating arm 26b. The ground electrodes 42b are connected to each other at the distal end of the first vibrating arm 26b. The first vibrating arm 26b is located between the signal electrodes 42a and the ground electrodes 42b. A current is taken out from the signal electrodes 42a and the ground electrodes 42b in accordance with the deformation of the other vibrating arm 26b.

The electrically conductive film 18 forms two pairs of first drive electrodes (second electrodes) 43a, 43b and two pairs of second drive electrodes (second electrodes) 44a, 44b. The first drive electrodes 43a are fixed to one second vibrating arm 27a. The first drive electrodes 43a extend on a face side and a back side of the second vibrating arm 27a on the basal side of the second vibrating arm 27a. The second vibrating arm 27a is located between the first drive electrodes 43a. The first drive electrodes 43b are fixed to the other second vibrating arm 27b. The first drive electrodes 43b extend on the face side and the back side of the second vibrating arm 27b on the free end side of the second vibrating arm 27b. The second vibrating arm 27b is located between the first drive electrodes 43b. The first drive electrodes 43b are connected to the first drive electrodes 43a at the base portion 25.

The second drive electrodes 44a are fixed to the one second vibrating arm 27a. The second drive electrodes 44a extend on the face side and the back side of the second vibrating arm 27a on the free end side of the second vibrating arm 27a. The second vibrating arm 27a is located between the second drive electrodes 44a. The second drive electrodes 44b are fixed to the other second vibrating arm 27b. The second drive electrodes 44b extend on the face side and the back side of the second vibrating arm 27b on the basal end side of the second vibrating arm 27b. The second vibrating arm 27b is located between the second drive electrodes 44b. The second drive electrodes 44b are connected to the second drive electrodes 44a at the base portion 25. When an electric field is applied between the first drive electrodes 43a, 43b and the second drive electrodes 44a, 44b, the second vibrating arms 27a, 27b are deformed.

The electrically conductive film 18 forms first detection wires (first wires) 45a, 45b and second detection wires (first wires) 46a, 46b. The first detection wires 45a, 45b are fixed to one first suspension arm 32a. A signal wire 45a and a ground wire 45b of the first detection wires extend on the first suspension arm 32a across the total length of the first suspension arm 32a. The signal wire 45a is connected to the signal electrode 41a. The ground electrode 45b is connected to the ground electrode 41b. The second detection wires 46a, 46b are fixed to the other first suspension arm 32b. A signal wire 46a and a ground wire 46b of the second detection wires extend on the first suspension arm 32b across the total length of the first suspension arm 32b. The signal wire 46a is connected to the signal electrode 42a. The ground wire 46b is connected to the ground electrode 42b.

The electrically conductive film 18 forms a first drive wire (second wire) 47 and a second drive wire (second wire) 48. The first drive wire 47 is fixed to one second suspension arm 33b. The first drive wire 47 extends on the second suspension arm 33b across the total length of the second suspension arm 33b. The first drive wire 47 is connected to the first drive electrodes 43a, 43b. The second drive wire 48 is fixed to the other second suspension arm 33a. The second drive wire 48 extends on the second suspension arm 33a across the total length of the second suspension arm 33a. The second drive wire 48 is connected to the second drive electrodes 44a, 44b.

Figure 3:
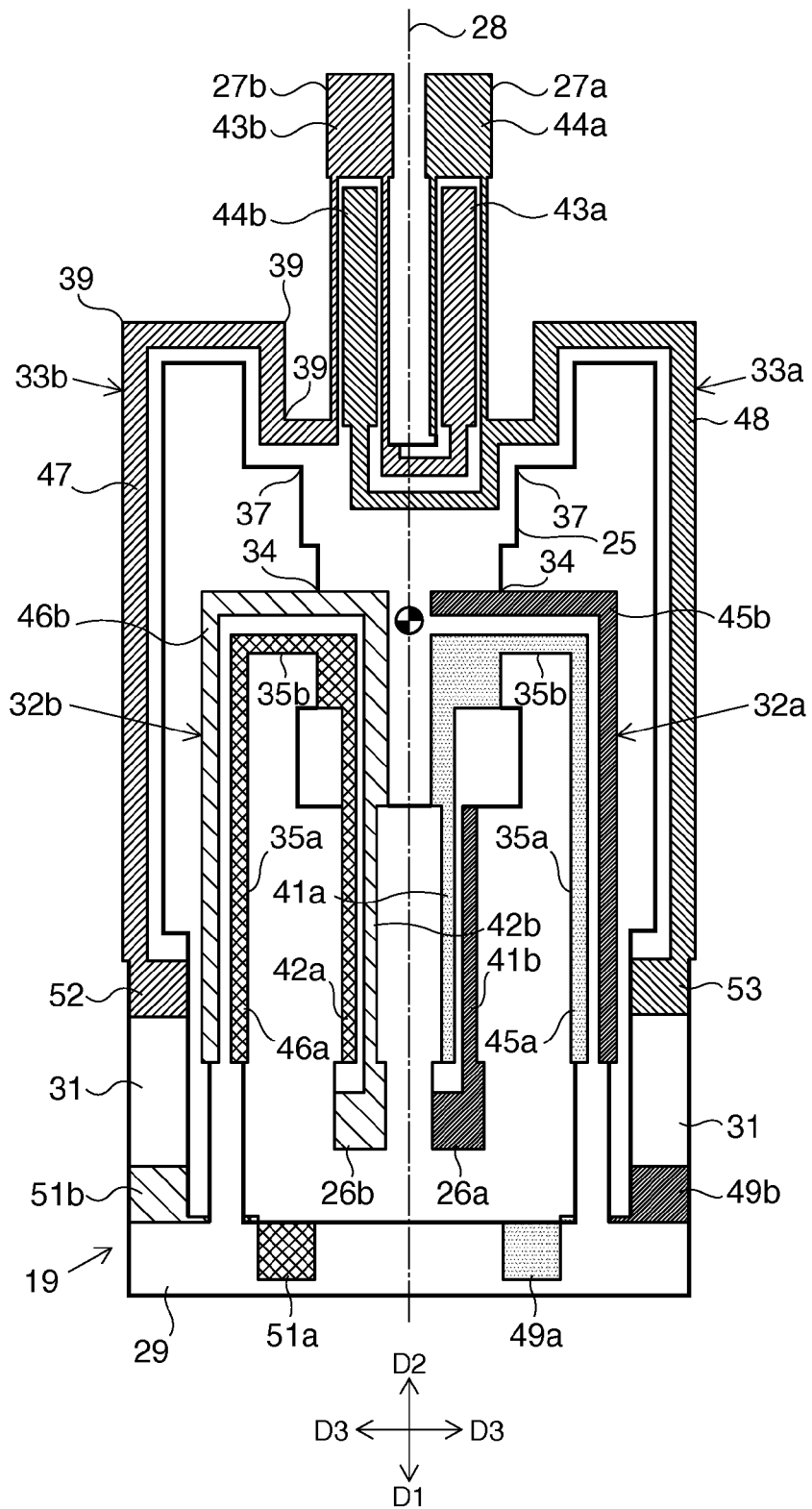
FIG. 3 is an enlarged perspective plan view schematically showing the configuration of a back side of the vibrating element, as viewed from the face side.

As shown in FIG. 3, the connection terminal group 21 includes a pair of first detection terminals 49a, 49b and a pair of second detection terminals 51a, 51b. A signal terminal (first electrically conductive terminal) 49a of the first detection terminals and a signal terminal (first electrically conductive terminal) 51a of the second detection terminals are fixed to the first fixed piece 29. The signal terminals 49a, 51a are arranged inside the pair of first suspension arms 32a, 32b. The signal terminal 49a of the first detection terminals is connected to the signal line 45a of the first detection wires. The signal terminal 51a of the second detection terminals is connected to the signal line 46a of the second detection wires. The signal terminals 49a, 51a are formed as pads made of an electrically conductive material.

A ground terminal (electrically conductive terminal for grounding) 49b of the first detection terminals and a ground terminal (electrically conductive terminal for grounding) 51b of the second detection terminals are fixed respectively to the second fixed pieces 31. The ground terminal 49b of the first detection terminals is connected to the ground wire 45b of the first detection wires. The ground terminal 51b of the second detection terminals is connected to the ground wire 46b of the second detection wires. The ground terminals 49b, 51b are formed as pads made of an electrically conductive material.

The connection terminal group 21 further includes a first drive terminal (second electrically conductive terminal) 52 and a second drive terminal (second electrically conductive terminal) 53. The first drive terminal 52 and the second drive terminal 53 are fixed respectively to the second fixed pieces 31. The first drive terminal 52 is connected to the first drive wire 47. The second drive terminal 53 is connected to the second drive wire 48. The ground terminal 51b of the second detection terminals is arranged between the first drive terminal 52 and the signal terminal 51a of the second detection terminals. The ground terminal 49b of the first detection terminals is arranged between the second drive terminal 53 and the signal terminal 49a of the first detection terminals.

2. Operation of Gyro Sensor According to First Embodiment

Figure 4:
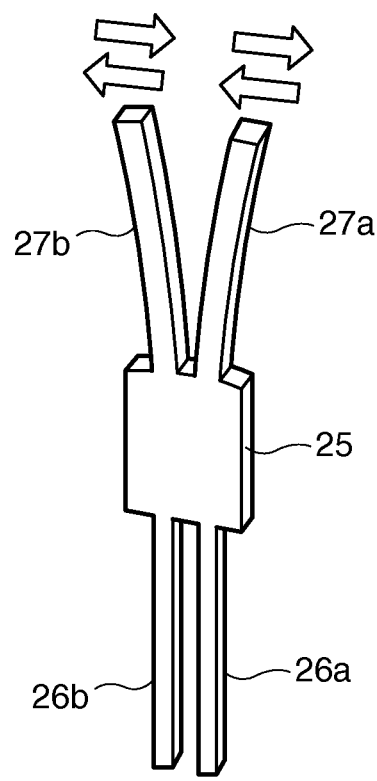
FIG. 4 is a perspective view of the vibrating element schematically showing how second vibrating arms, that is, vibrating arms for driving, vibrate.

Next, the operation of the gyro sensor 11 will be described briefly. As shown in FIG. 4, vibration is excited by the second vibrating arms 27a, 27b in detecting angular velocity. When exciting vibration, a drive signal is inputted to the vibrating element 15 from the first drive terminal 52 and the second drive terminal 53. Consequently, between the first drive electrodes 43a, 43b and the second drive electrodes 44a, 44b, an electric field acts on the main body 17 of the vibrating element 15. As a waveform with a specific frequency is inputted, the second vibrating arms 27a, 27b flex between the first reference plane RP1 and the second reference plane RP2. The second vibrating arms 27a, 27b repeat moving toward and away from each other.

Figure 5:
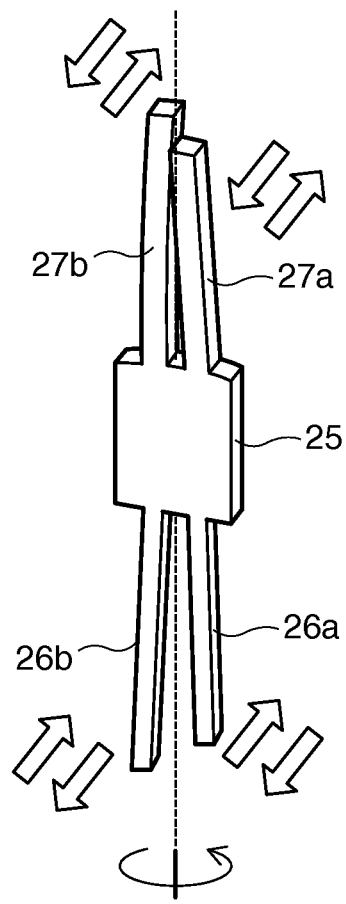
FIG. 5 is a perspective view of the vibrating element schematically showing how first vibrating arms, that is, vibrating arms for detection, vibrate.

When an angular velocity motion is applied to the gyro sensor 11, the direction of vibration of the second vibrating arms 27a, 27b is changed by the action of a Coriolis force, as shown in FIG. 5. So-called walk-mode excitation is generated. At this point, a new force component is generated parallel to the symmetry plane 28, corresponding to the Coriolis force. The second vibrating arms 27a, 27b flex parallel to the symmetry plane 28. The second vibrating arms 27a, 27b swing around the center of gravity of the base portion 25.

The walk-mode excitation of the second vibrating arms 27a, 27b propagates to the first vibrating arms 26a, 26b from the base portion 25. Consequently, a motion of the first vibrating arms 26a, 26b is generated based on the force component parallel to the symmetry plane 28. The first vibrating arms 26a, 26b flex parallel to the symmetry plane 28. The first vibrating arms 26a, 26b swing around the center of gravity of the base portion 25. In accordance with this flexure of the first vibrating arms 26a, 26b, an electric field based on a piezoelectric effect is generated in the main body 17 and an electric charge is generated. The flexure of the first vibrating arm 26a generates a potential difference between the signal electrode 41a and the ground electrode 41b of the first detection electrodes. This potential difference is outputted from the first detection terminals 49a, 49b. Similarly, the flexure of the first vibrating arm 26b generates a potential difference between the signal electrode 42a and the ground electrode 42b of the second detection electrodes. This potential difference is outputted from the second detection terminals 51a, 51b. Thus, an electrical signal corresponding to the angular velocity is outputted from the gyro sensor 11.

Figure 6:
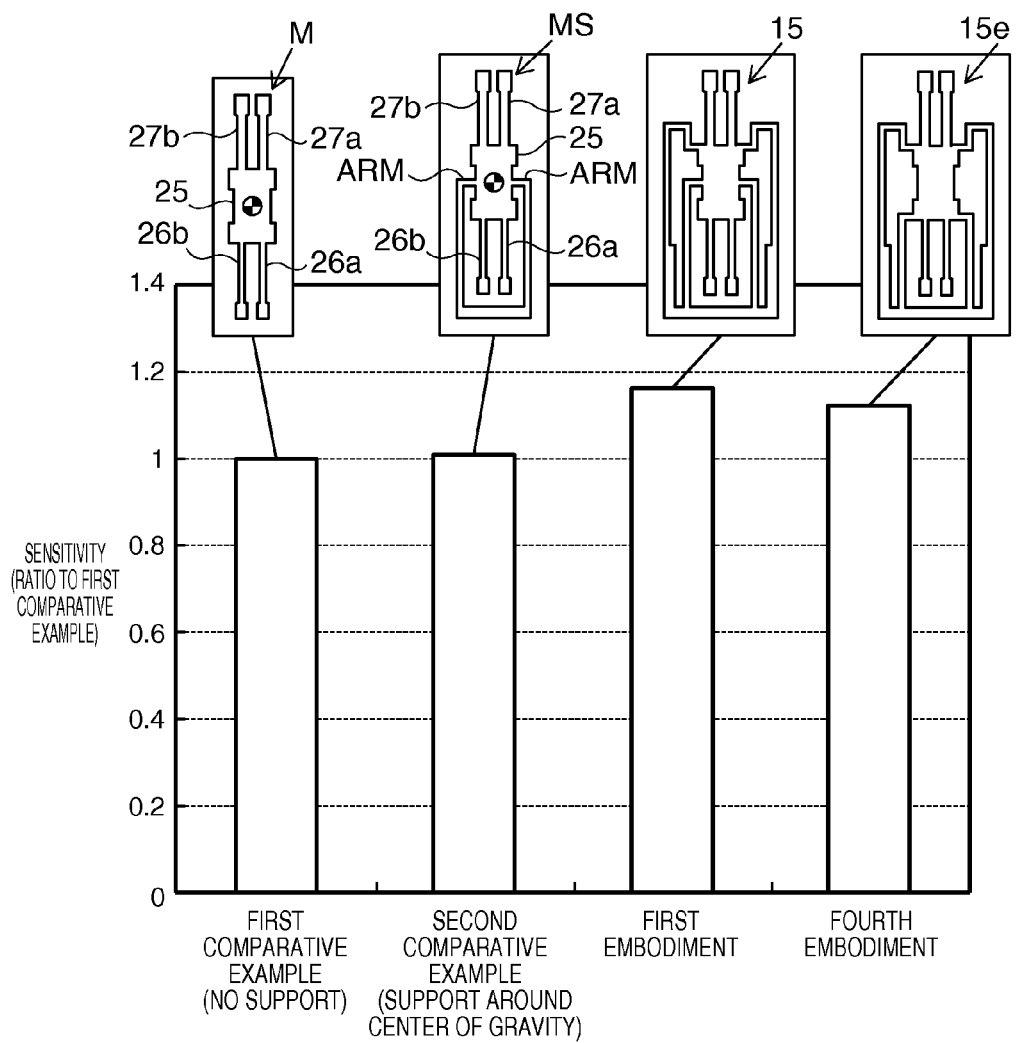
FIG. 6 is a graph showing the result of a simulation to specify the sensitivity of the vibrating element.

The inventor observes the sensitivity of the vibrating element 15. A computer simulation is used for the observation. When an angular velocity motion is applied to the vibrating element 15 in the state where the second vibrating arms 27a, 27b are flexing, as described above, walk-mode vibration is excited in the first vibrating arms 26a, 26b. The amplitude of the vibration of the first vibrating arms 26a, 26b, that is, the sensitivity of the vibrating element 15 is measured. In the observation, the inventor prepares a first comparative example and a second comparative example. As shown in FIG. 6, the supporting structure is omitted in a simulation model M according to the first comparative example. The simulation model M is constructed with the base portion 25, the first vibrating arms 26a, 26b and the second vibrating arms 27a, 27b. In a simulation model MS according to the second comparative example, a pair of suspension arms ARM penetrating the center of gravity of the base portion 25 support the base portion 25. The number of suspension arms ARM is limited to two.

As shown in FIG. 6, it is confirmed that the motion of the first vibrating arms 26a, 26b of the vibrating element 15 according to the first embodiment is amplified, compared with the first comparative example and the second comparative example. Therefore, it is confirmed that the detection sensitivity of the vibrating element 15 is enhanced, compared with the first comparative example and the second comparative example.

Moreover, in this vibrating element 15, the first detection wires 45a, 45b and the second detection wires 46a, 46b are fixed respectively to the first suspension arms 32a, 32b. The first drive wire 47 and the second drive wire 48 are fixed to the second suspension arms 33a, 33b. The first detection wires 45a, 45b and the second detection wires 46a, 46b can be separated from the first drive wire 47 and the second drive wire 48 by the space. Consequently, electrostatic coupling between the first and second detection wires 45a, 45b, 46a, 46b and the first and second drive wires 47, 48 can be reduced significantly, compared with the case where the wires connected to the electrodes fixed to the second vibrating arms 27a, 27b (vibrating arms for driving) and the wires connected to the electrodes fixed to the first vibrating arms 26a, 26b (vibrating arms for detection) coexist on a single suspension arm. Such a reduction in electrostatic coupling can greatly contribute to improvement in the S/N ratio of the gyro sensor 11.

In the fixed portion 19, the second fixed pieces 31 are connected to the first fixed piece 29. The second fixed pieces 31 are situated further toward the second direction D2 than the first fixed piece 29. Therefore, the first drive terminal 52 and the second drive terminal 53 can be located away from the first fixed piece 29 toward the second direction D2. The fixed portion 19 can be prevented from spreading in the first direction D1 even when the first drive terminal 52 and the second drive terminal 53 are pulled away from the first detection terminals (particularly the signal terminal 49a) and the second detection terminals (particularly the signal terminal 51a). Thus, an increase in the overall size of the vibrating element 15 can be avoided. A number of connection terminals can be arranged on the fixed portion 19 without causing an increase in size.

Moreover, in the fixed portion 19, the ground terminals 49b, 51b are arranged between the signal terminals 49a, 51a and the first and second drive terminals 52, 53. The ground terminals 49b, 51b have a shielding function between the signal terminals 49a, 51a and the first and second drive terminals 52, 53. Therefore, electrostatic coupling between the signal terminals 49a, 51a and the first and second drive terminals 52, 53 can securely be avoided.

In this vibrating element 15, the base portion 25 is supported by the four suspension arms, that is, the first suspension arms 32a, 32b and the second suspension arms 33a, 33b. Therefore, the strength against shock of the vibrating element 15 can be increased. Also, the first detection wires 45a, 45b and the second detection wires 46a, 46b can be allocated to the pair of first suspension arms 32a, 32b, respectively, the degree of freedom in wiring can be increased.

3. Gyro Sensor According to Second Embodiment

Figure 7:
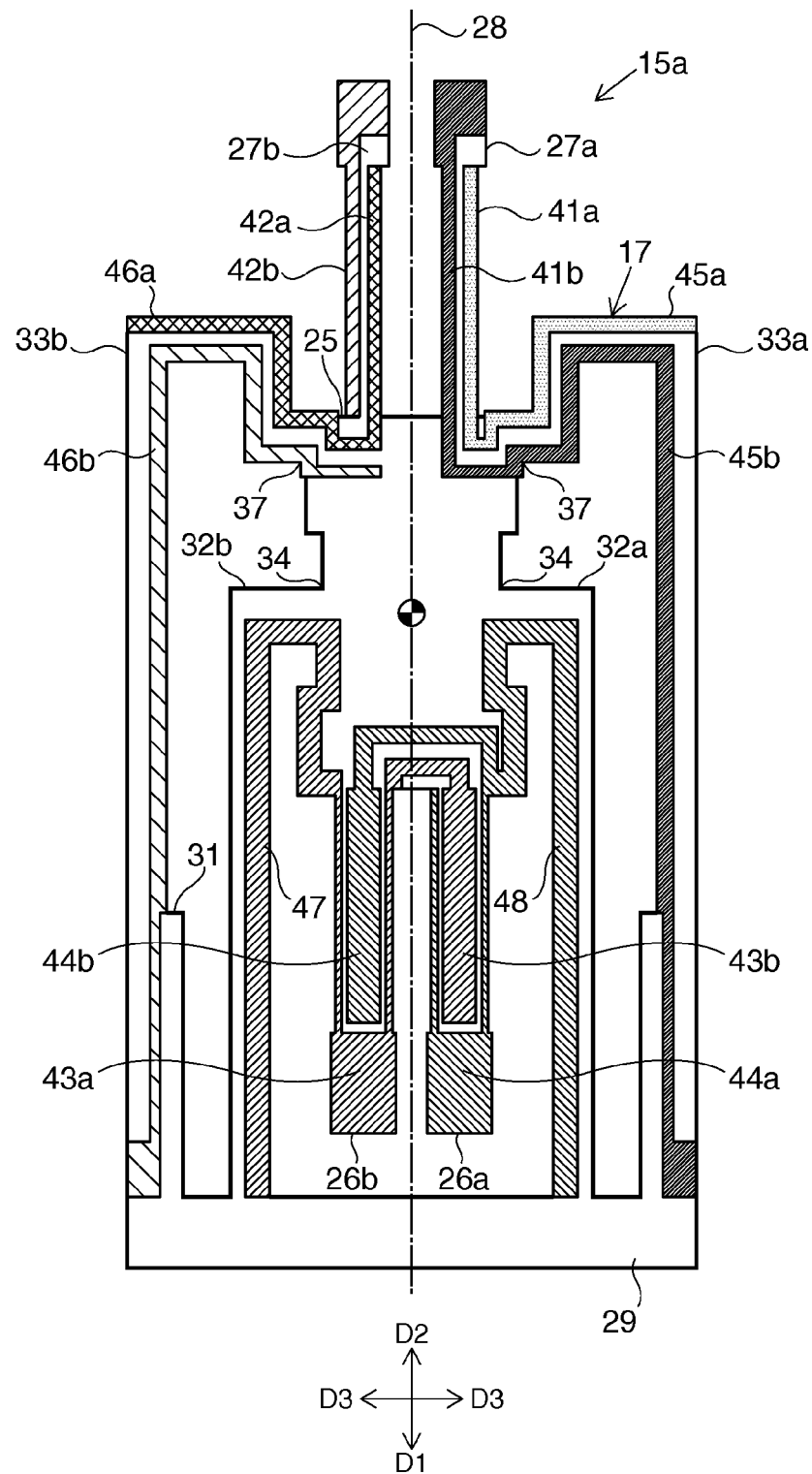
FIG. 7 is an enlarged plan view schematically showing the configuration of a face side of a vibrating element incorporated in a gyro sensor according to a second embodiment.
Figure 8:
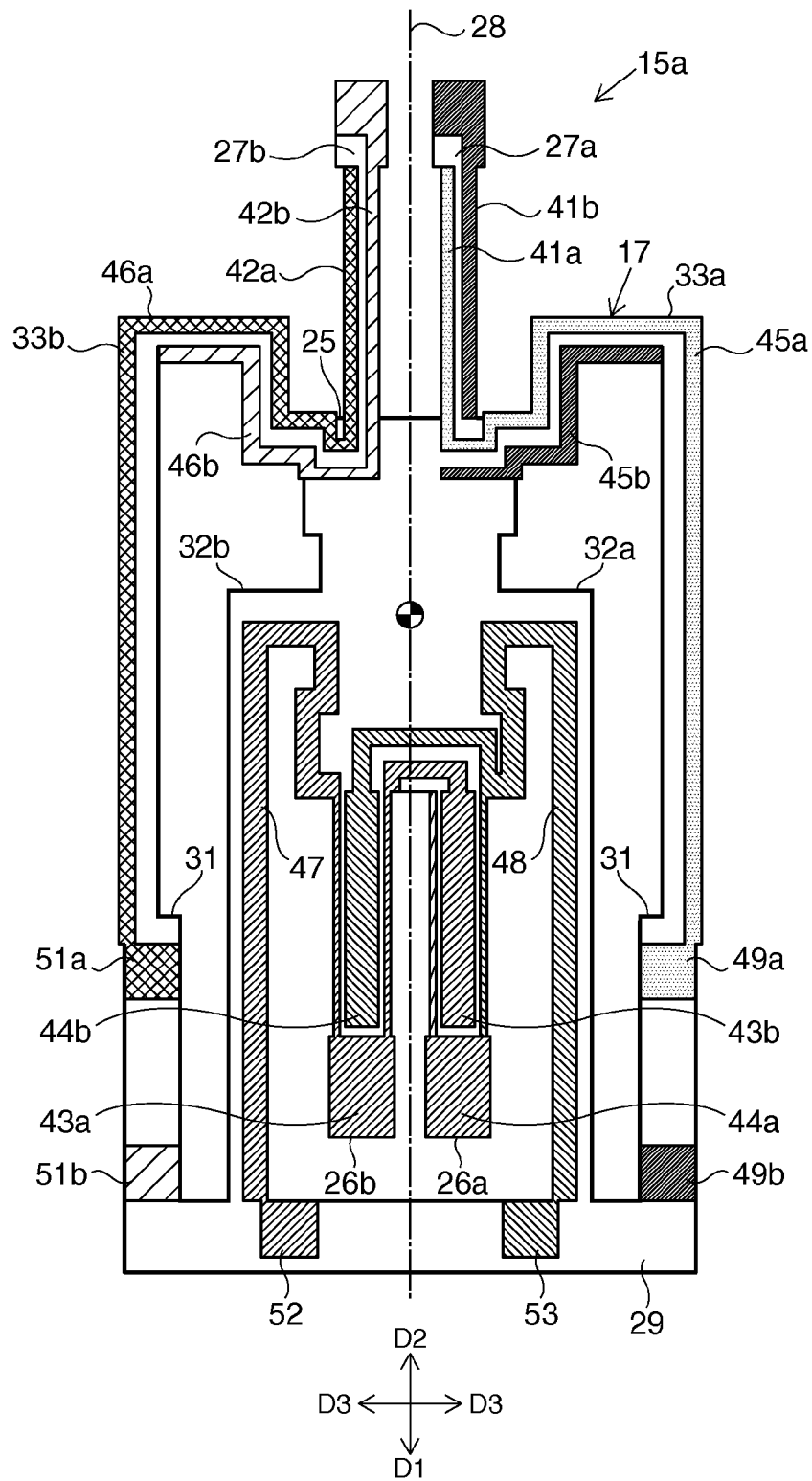
FIG. 8 is an enlarged plan view schematically showing the configuration of a back side of the vibrating element incorporated in the gyro sensor according to the second embodiment, as viewed from the face side.

FIGS. 7 and 8 schematically show a vibrating element 15a incorporated in a gyro sensor according to a second embodiment. In this vibrating element 15a, the pair of first vibrating arms 26a, 26b function as a pair of vibrating arms for driving, and the pair of second vibrating arms 27a, 27b function as a pair of vibrating arms for detection. The first detection electrodes 41a, 41b are fixed to the one second vibrating arm 27a. The second detection electrodes 42a, 42b are fixed to the other second vibrating arm 27b. The first drive electrodes 43a, 43b are fixed to the first vibrating arms 26a, 26b, respectively. The second drive electrodes 44a, 44b are fixed to the first vibrating arms 26a, 26b, respectively. The first detection wires 45a, 45b are fixed to one second suspension arm 33a. The second detection wires 46a, 46b are fixed to the other second suspension arm 33b. The first drive wire 47 and the second drive wire 48 are fixed to the first suspension arms 32b, 32a, respectively. The signal terminal 49a of the first detection terminals and the signal terminal 51a of the second detection terminals are fixed to the second fixed pieces 31, respectively. The first drive terminal 52 and the second drive terminal 53 are fixed to the first fixed piece 29. The other structures are similar to the vibrating element 15. In FIGS. 7 and 8, the same configurations and structures as in the vibrating element 15 are denoted by the same reference numerals and are not described further in detail. Such a vibrating element 15a can achieve similar effects and advantages to the foregoing vibrating element 15.

4. Gyro Sensor According to Third Embodiment

Figure 9:
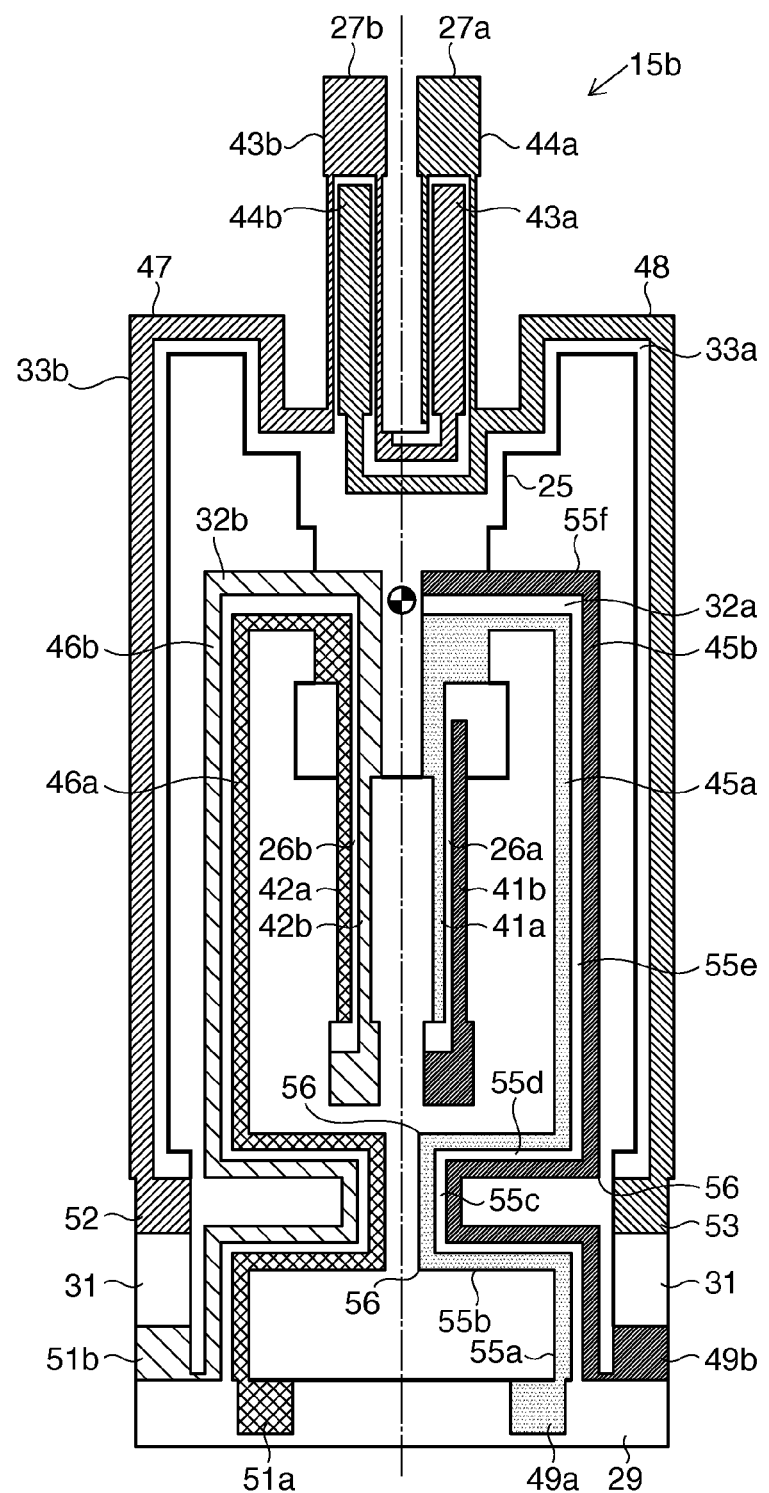
FIG. 9 is an enlarged plan view schematically showing the configuration of a face side of a vibrating element incorporated in a gyro sensor according to a third embodiment.

FIG. 9 schematically shows a vibrating element 15b incorporated in a gyro sensor according to a third embodiment. In this vibrating element 15b, each of the first suspension arms 32a, 32b includes six straight arms 55a to 55f. The straight arm 55a linearly extends in the second direction D2 from the first fixed piece 29. The straight arm 55f extends in the third direction D3 from the first connecting part 34. The straight arm 55e extends in the first direction D1 from the distal end of the straight arm 55f. The straight arm 55a and the straight arm 55e extend on the same straight line. The straight arm 55c extends parallel to the second fixed piece 31. The straight arm 55c is arranged at a position further away from the second fixed piece 31, compared with the straight arms 55a, 55e. The straight arm 55b connects one end of the straight arm 55c to the distal end of the straight arm 55a. The straight arm 55d connects the other end of the straight arm 55c to the distal end of the straight arm 55e. The five straight arms 55a to 55e form a crank. Four flexure parts 56 are formed between the straight arms 55a to 55e. Thus, in the first suspension arms 32a, 32b, at least two flexure parts 56 are established. The flexure parts 56 may be formed by bending or curving.

In the vibrating element 15b, the five straight arms 55a to 55e are used instead of the single first straight arm 35a, and the total length of the first suspension arms 32a, 32b can be increased. Consequently, the first suspension arms 32a, 32b can be given elastic deformability. Also, the support rigidity of the base portion 25 can be weakened and therefore the transmission of vibration from outside can be reduced. That is, vibration resistance and shock resistance can be enhanced. Moreover, since the straight arm 55c is located away from the first drive terminal 52 and the second drive terminal 53, the first detection wires 45a, 45b and the second detection wires 46a, 46b on the first suspension arms 32a, 32b can be located away from the first drive terminal 52 and the second drive terminal 53. Consequently, electrostatic coupling between each detection wire and each drive terminal can be restrained more securely.

Figure 10:
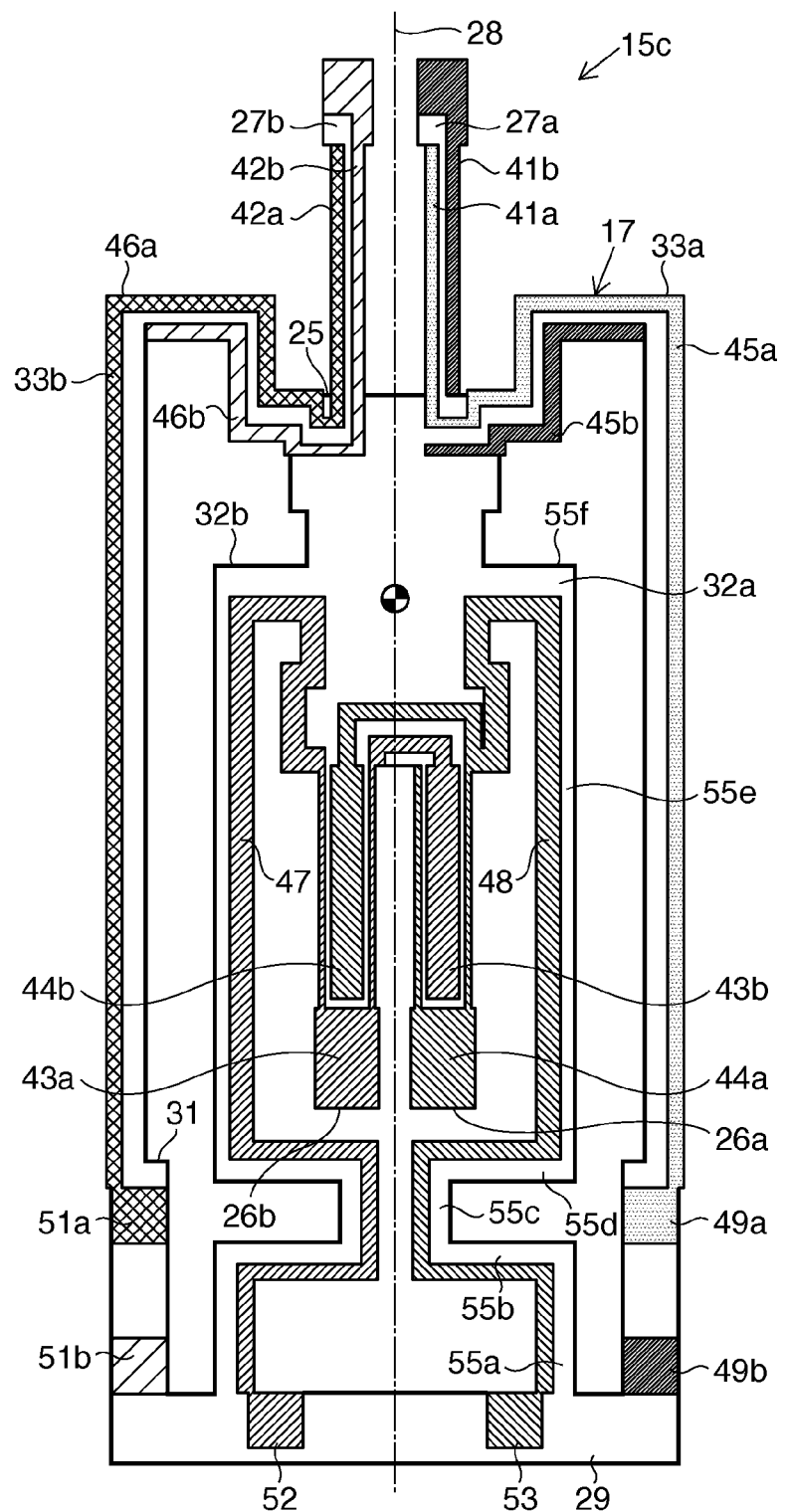
FIG. 10 is an enlarged plan view schematically showing the configuration of a face side of a vibrating element incorporated in a gyro sensor according to a modification of the third embodiment.

FIG. 10 schematically shows a vibrating element 15c incorporated in a gyro sensor according to a modification of the third embodiment. Here, the first suspension arms 32a, 32b of the vibrating element 15a are replaced by the combination of straight arms 55a to 55f. The other structures are the same as in the vibrating element 15a. The first drive wire 47 and the second drive wire 48 on the first suspension arms 32a, 32b can be located away from the signal terminals 49a, 51a of the first detection terminals and the second detection terminals, respectively. Consequently, electrostatic coupling between each drive wire and each detection terminal can securely be restrained.

5. Gyro Sensor According to Fourth Embodiment

Figure 11:
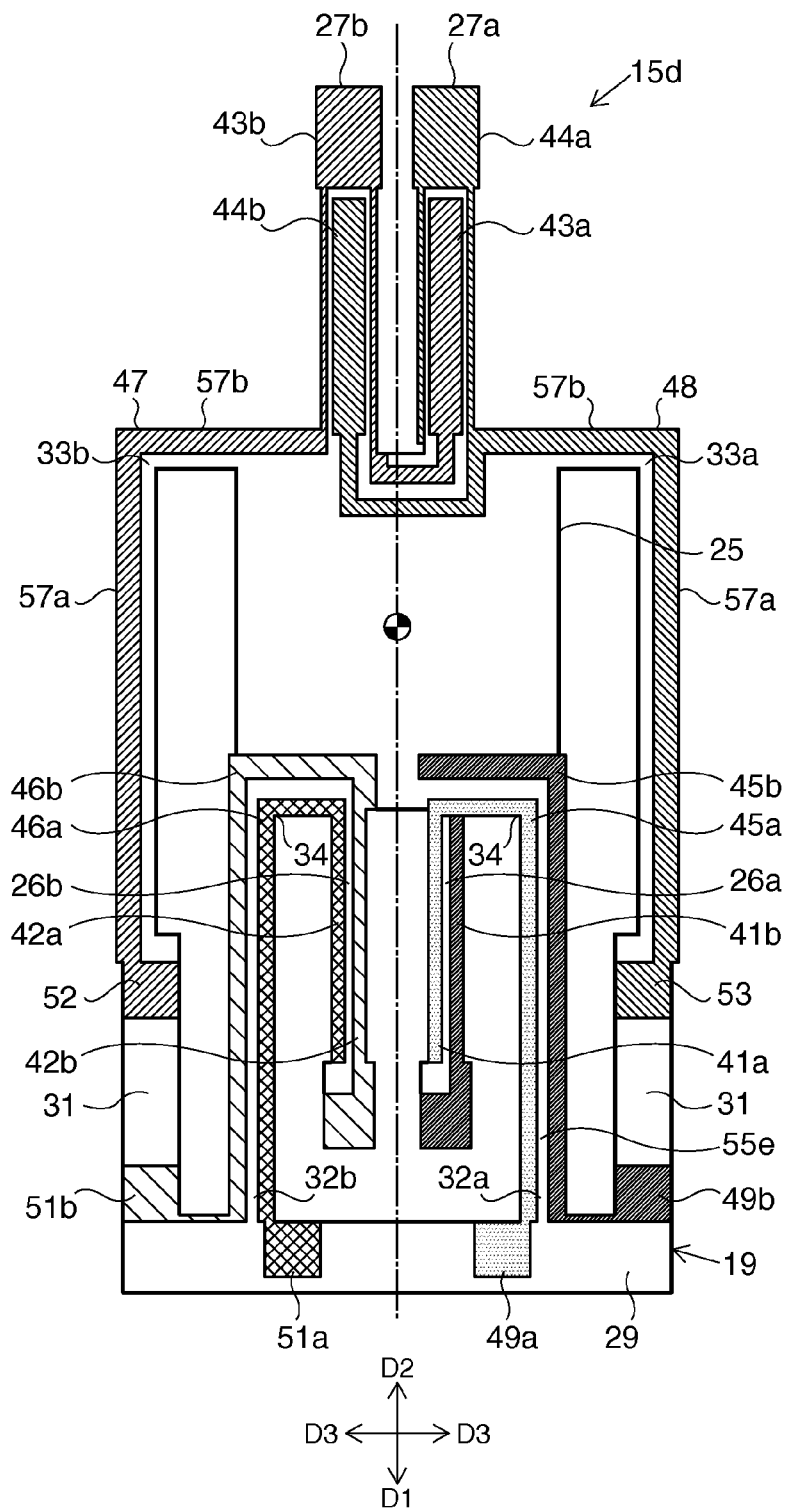
FIG. 11 is an enlarged plan view schematically showing the configuration of a face side of a vibrating element incorporated in a gyro sensor according to a fourth embodiment.
Figure 12:
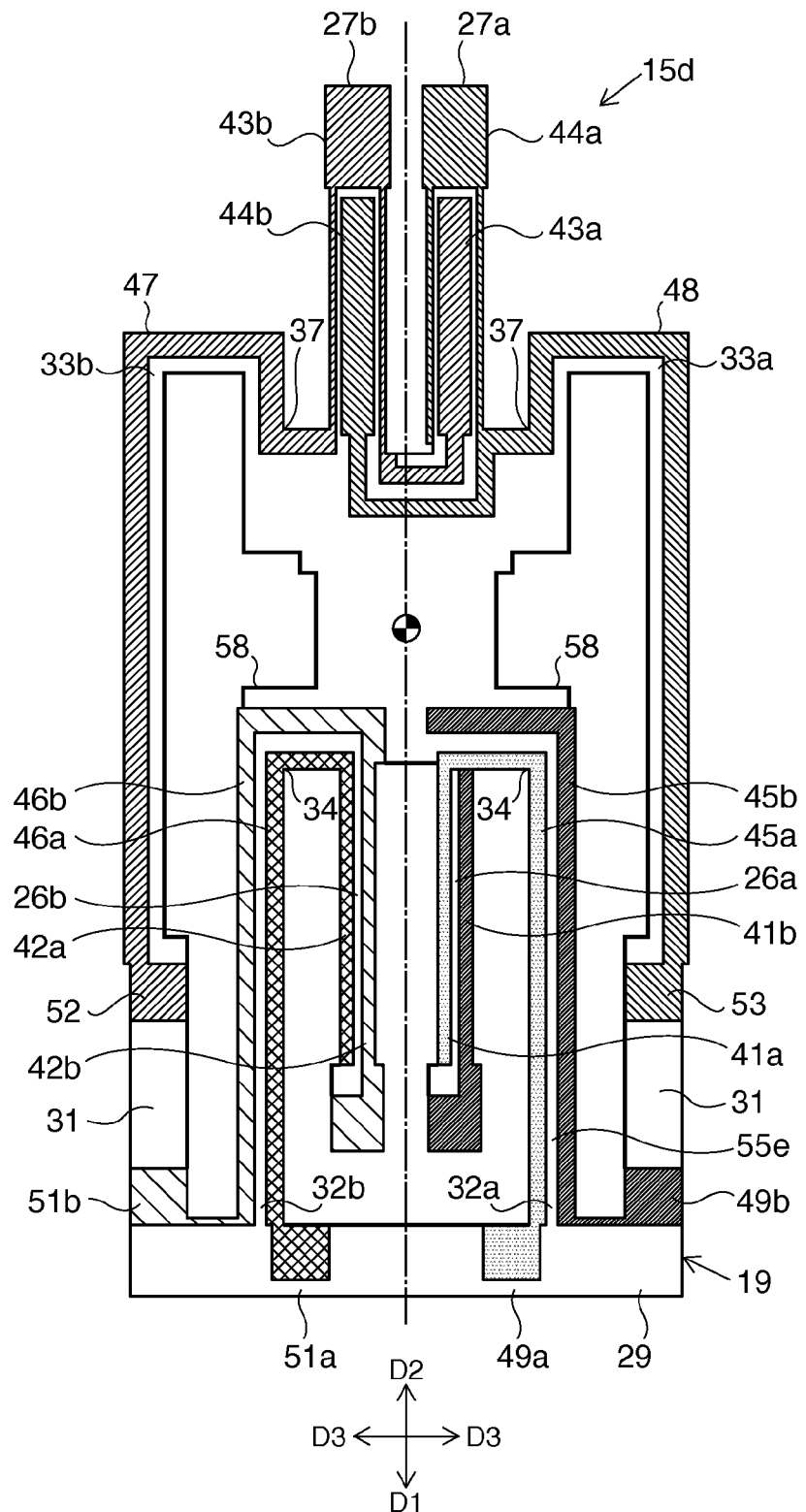
FIG. 12 is an enlarged plan view schematically showing the configuration of a face side of a vibrating element incorporated in a gyro sensor according to a modification of the fourth embodiment.

FIG. 11 schematically shows a vibrating element 15d incorporated in a gyro sensor according to a fourth embodiment. In this vibrating element 15d, each of the first suspension arms 32a, 32b linearly extends between the fixed portion 19 and the base portion 25. The other words, the first suspension arms 32a, 32b are formed by a single straight arm. Consequently, the first connecting parts 34 of the first suspension arms 32a, 32b are formed on an end surface of the base portion 25. The first connecting parts 34 shift in the first direction D1 from the center of gravity of the base portion 25. Each of the second suspension arms 33a, 33b includes two straight arms 57a, 57b. Thus, formation of flexure parts in the suspension arms is avoided as much as possible. Therefore, the strength of the suspension arms 32a, 32b, 33a, 33b can be increased. Moreover, processing of the vibrating element 15d can be simplified. Consequently, the manufacturing cost can be reduced. The other configurations can be the same as the vibrating element 15. Also, in the base portion 25, a cut-out 58 can be formed between the first connecting part 34 and the second connecting part 37, as shown in FIG. 12. The base portion 25 may thus be reduced in weight. As is clear from FIG. 6, according to the observation by the inventor, it is confirmed that the detection sensitivity of the vibrating element 15d is enhanced compared with the first comparative example and the second comparative example, even when the first connecting parts 34 shift in the first direction D1 from the center of gravity of the base portion 25. In this embodiment, the pair of first vibrating arms 26a, 26b may function as a pair of vibrating arms for detection, whereas the pair of second vibrating arms 27a, 27b may function as a pair of vibrating arms for driving. Alternatively, the pair of first vibrating arms 26a, 26b may function as a pair of vibrating arms for driving, whereas the pair of second vibrating arms 27a, 27b may function as a pair of vibrating arms for detection. In this embodiment, though formation of flexure parts is avoided as much as possible, a similar crank to the foregoing straight arms 55a to 55e may be formed in the first suspension arms 32a, 32b.

6. Gyro Sensor According to Fifth Embodiment

Figure 13:
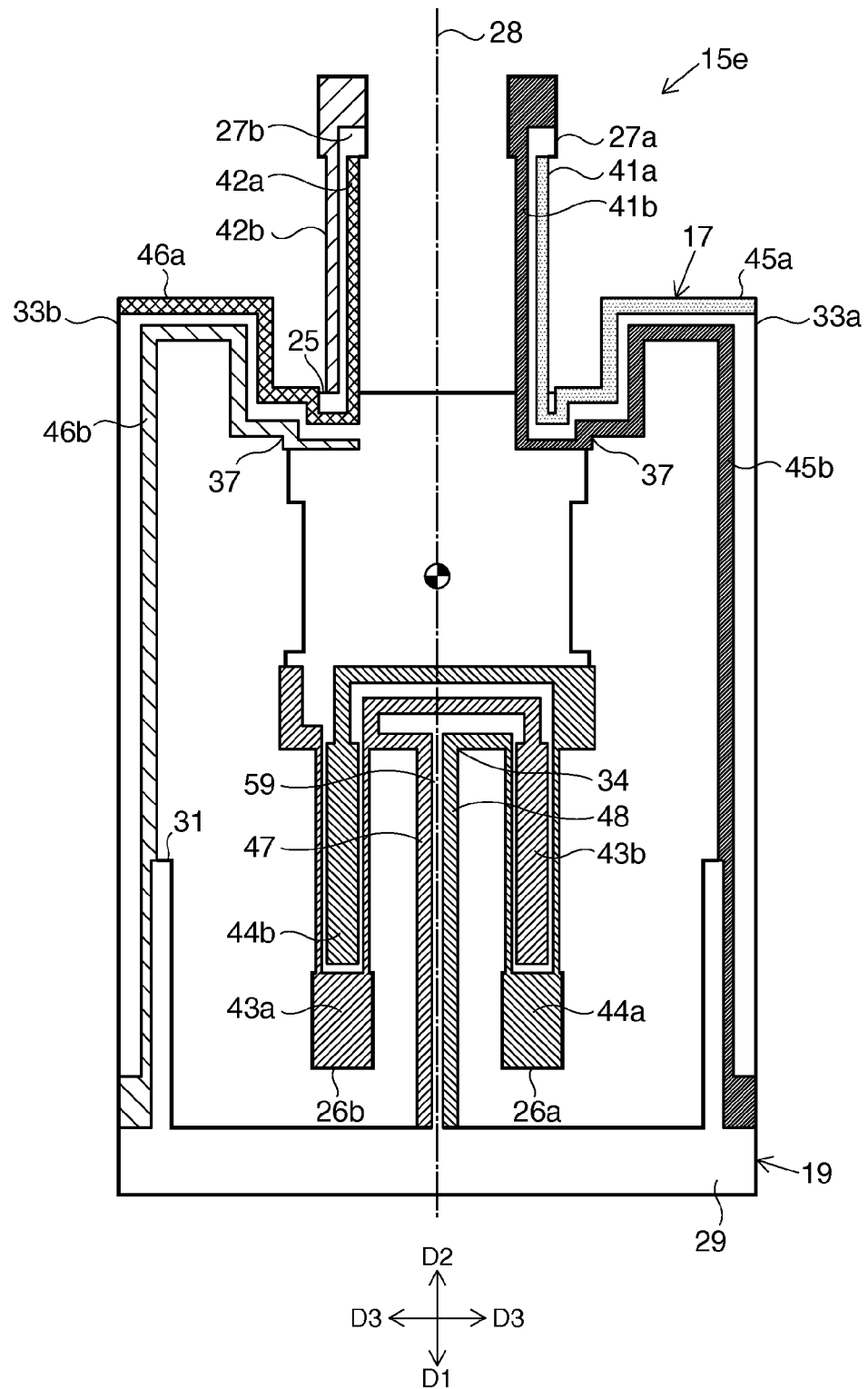
FIG. 13 is an enlarged plan view schematically showing the configuration of a face side of a vibrating element incorporated in a gyro sensor according to a fifth embodiment.
Figure 14:
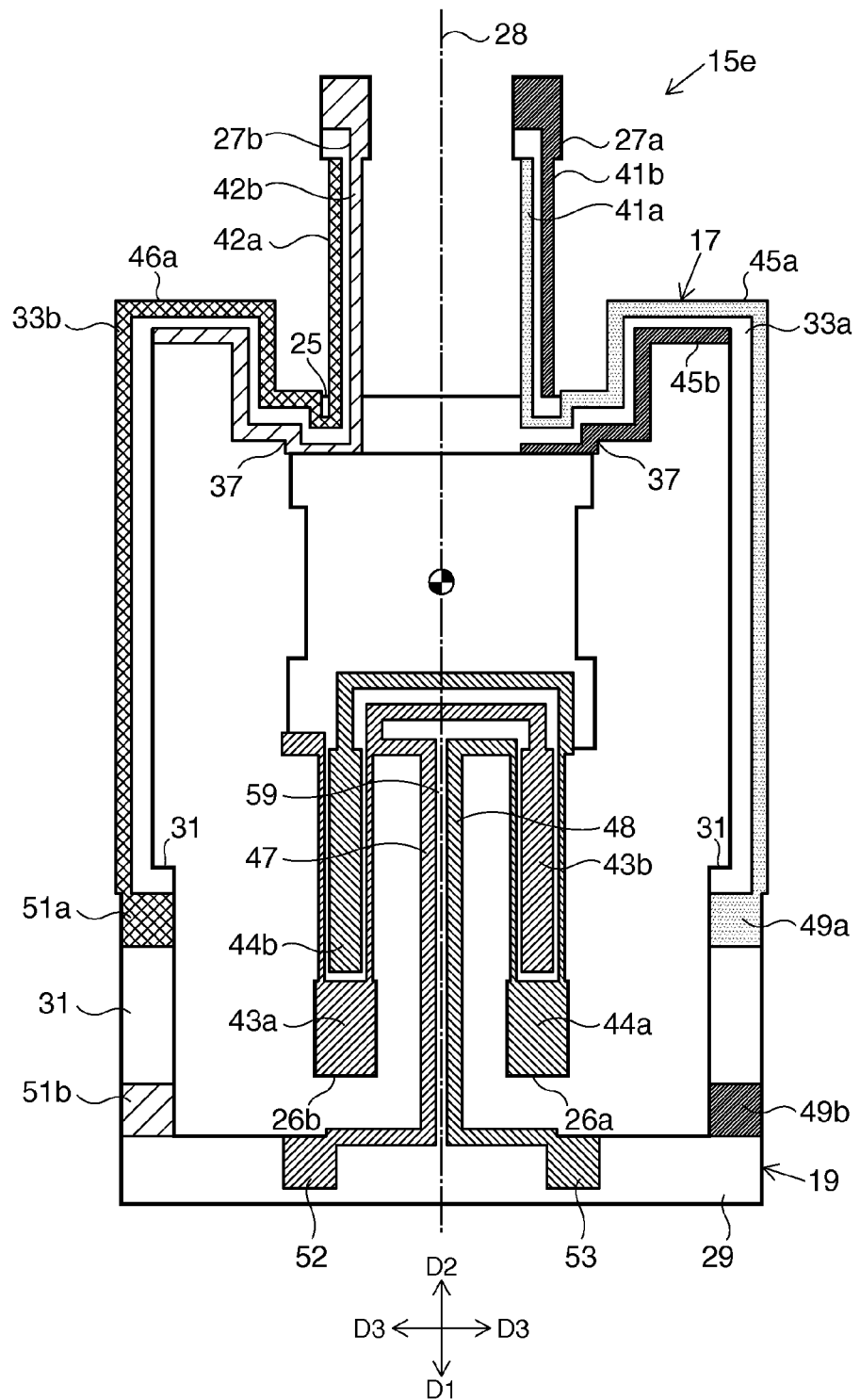
FIG. 14 is an enlarged plan view schematically showing the configuration of a back side of the vibrating element incorporated in the gyro sensor according to the fifth embodiment, as viewed from the face side.

FIG. 13 schematically shows a vibrating element 15e incorporated in a gyro sensor according to a fifth embodiment. In this vibrating element 15e, a single first suspension arm 59 is used instead of the pair of suspension arms 32a, 32b. The first suspension arm 59 connects the base portion 25 and the fixed portion 19 to each other between the pair of first vibrating arms 26a, 26b. The first suspension arm 59 can linearly extend between the base portion 25 and the fixed portion 19. Here, as in the vibrating element 15a, the pair of first vibrating arms 26a, 26b function as a pair of vibrating arms for driving and the pair of second vibrating arms 27a, 27b function as a pair of vibrating arms for detection. The first drive wire 47 and the second drive wire 48 are fixed to the single first suspension arm 59.

With such a configuration, the structure of the vibrating element 15e can be simplified. Moreover, the pair of second suspension arms 33a, 33b can be pulled away to the maximum from the first suspension arm 59. The first suspension arm 59 and the second suspension arms 33a, 33b can be separated from each other by the maximum space. Electrostatic coupling between the first detection wires 45a, 45b and the second detection wires 46a, 46b, and the first and second drive wires 47, 48, can be reduced to the maximum extent.

Figure 15:
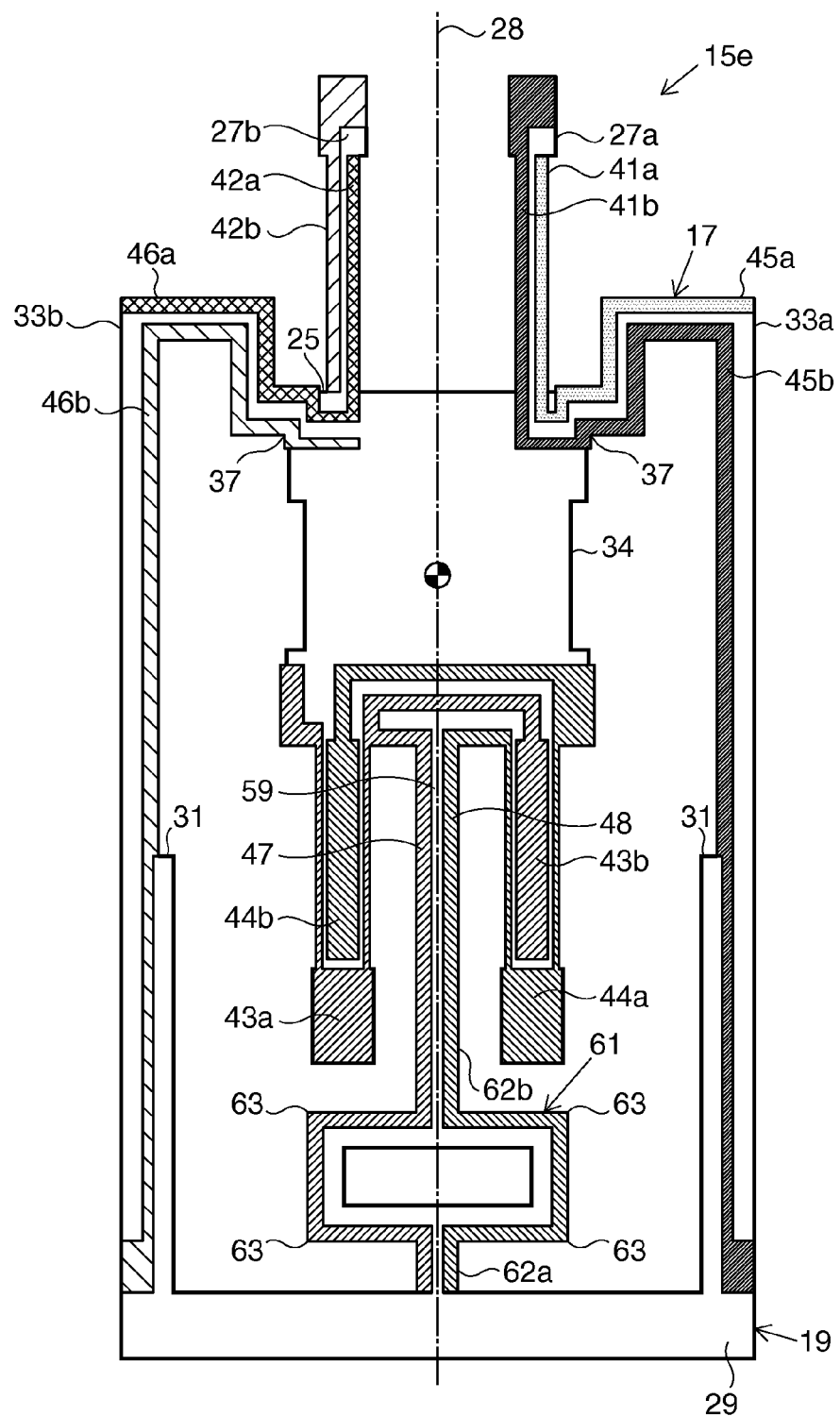
FIG. 15 is an enlarged plan view schematically showing the configuration of a face side of a vibrating element incorporated in a gyro sensor according to a modification of the fifth embodiment.

The first suspension arm 59 can be provided with a frame body 61, as shown in FIG. 15. The frame body 61 is located between a straight arm 62a and a straight arm 62b. The straight arm 62a and the straight arm 62b are connected to each of two sides extending parallel to each other. Four flexure parts 63 are formed in the frame body 61. Thus, at least two flexure parts 63 are established in the first suspension arm 59. Therefore, the total length of the first suspension arm 59 can be increased. Consequently, the first suspension arm 59 can be given elastic deformability. Also, the support rigidity of the base portion 25 can be weakened and therefore transmission of vibration from outside can be reduced. That is, vibration resistance and shock resistance can be enhanced. The flexure parts 63 may be formed by bending or curving.

7. Electronic Apparatus and Other Applications

Figure 16:
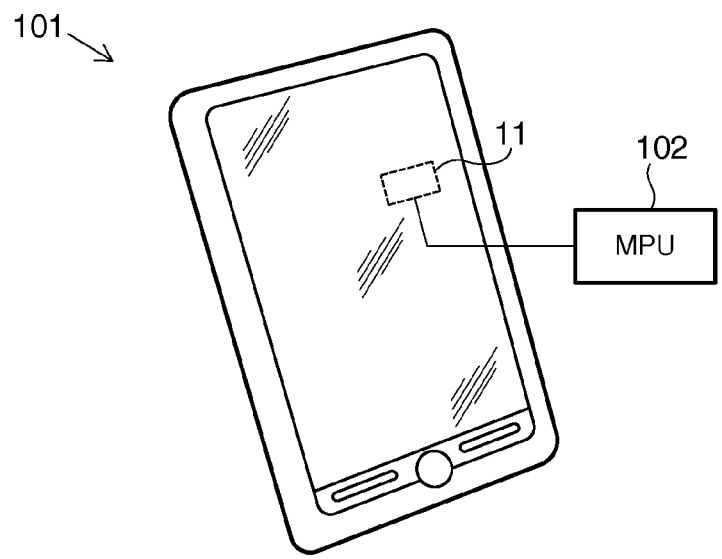
FIG. 16 is a conceptual view schematically showing the configuration of a smartphone as a specific example of an electronic apparatus.

FIG. 16 schematically shows a smartphone 101 as a specific example of an electronic apparatus. The gyro sensor 11 having the vibrating element 15, 15a to 15e is installed in the smartphone 101. The gyro sensor 11 can detect the attitude of the smartphone 101. So-called motion sensing is implemented. A detection signal from the gyro sensor 11 can be supplied, for example, to a microcomputer chip (MPU) 102. The MPU 102 can execute various kinds of processing according to the motion sensing. Also, such motion sensing can be utilized in electronic apparatuses such as mobile phone, portable game machine, game controller, car navigation system, pointing device, head mount display, and tablet PC. The gyro sensor 11 is installed in order to realize the motion sensing.

Figure 17:
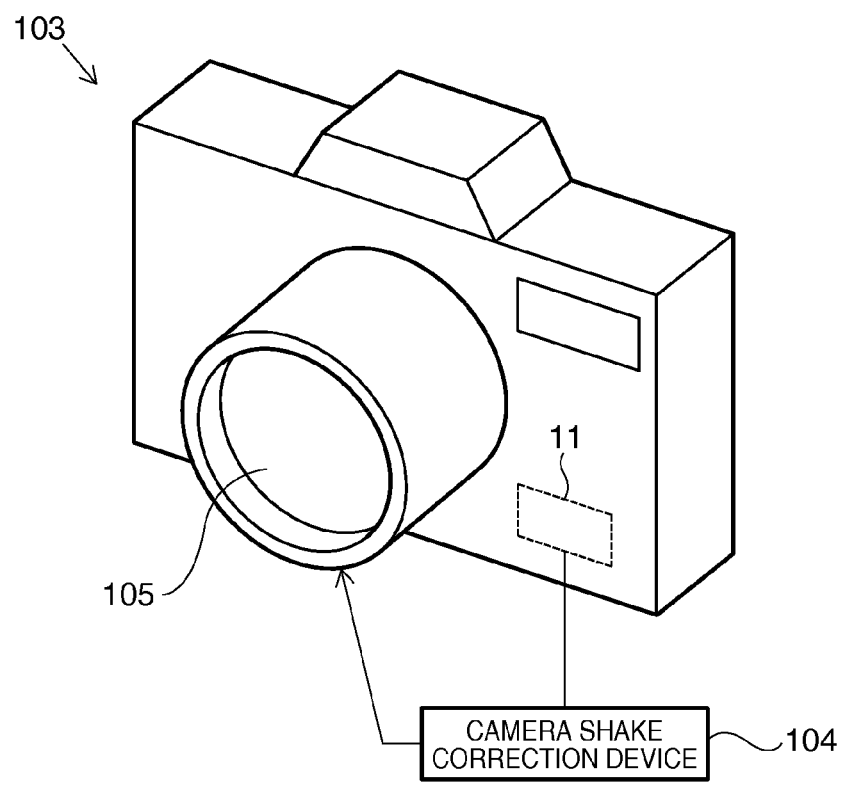
FIG. 17 is a conceptual view schematically showing the configuration of a digital still camera as another specific example of the electronic apparatus.

FIG. 17 schematically shows a digital still camera (hereinafter referred to as a "camera") 103 as another specific example of the electronic apparatus. The gyro sensor 11 having the vibrating element 15, 15a to 15e is installed in the camera 103. The gyro sensor 11 can detect the attitude of the camera 103. A detection signal from the gyro sensor 101 can be supplied to a camera shake correction device 104. The camera shake correction device 104 can move, for example, a specific lens in a lens set 105 according to the detection signal from the gyro sensor 11. Camera shake can thus be corrected. Also, the camera shake correction can be utilized in a digital video camera. The gyro sensor 11 is installed in order to realize the camera shake correction.

Figure 18:
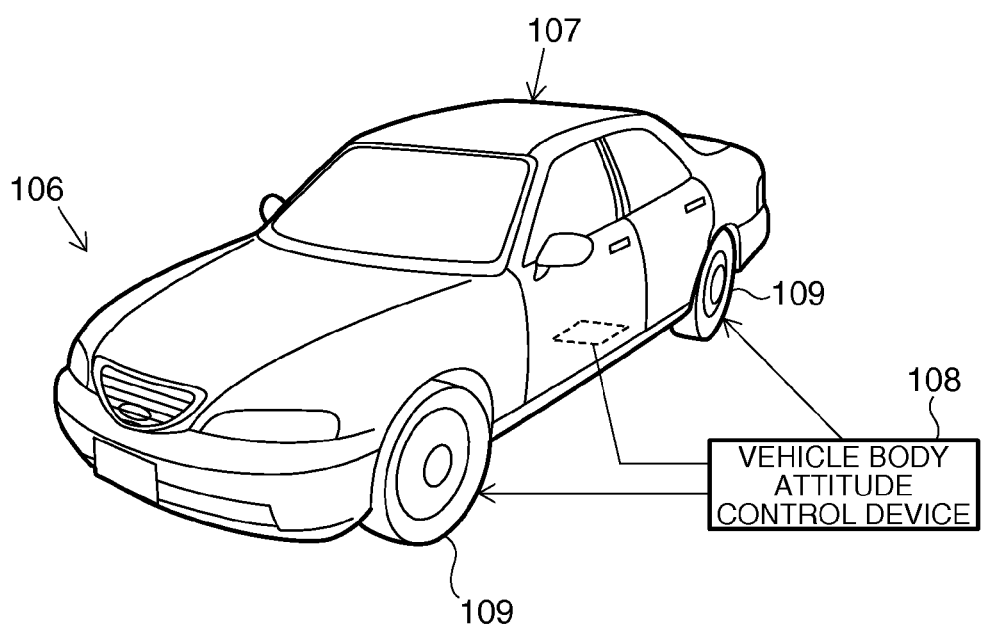
FIG. 18 is a conceptual view schematically showing the configuration of an automobile as a specific example of a moving object.

FIG. 18 schematically shows an automobile 106 as a specific example of a moving object. The gyro sensor 11 having the vibrating element 15, 15a to 15e is installed in the automobile 106. The gyro sensor 11 can detect the attitude of a vehicle body 107. A detection signal from the gyro sensor 11 can be supplied to a vehicle body attitude control device 108. The vehicle body attitude control device 108 can, for example, control hard or soft suspension setting or control the brakes on individual wheels 109 according to the attitude of the vehicle body 107. Also, such attitude control can be utilized in a biped robot or radio-controlled helicopter. The gyro sensor 11 is installed in order to realize the attitude control.

The embodiments are described above in detail. However, a person skilled in the art can easily understand that various modifications can be made without substantially departing from the novel features and advantages of the invention. Therefore, all such modifications are included in the scope of the invention. For example, while an example of using crystal as the material of the vibrating element is described in the above embodiments and modifications, other piezoelectric materials than crystal can be used. For example, aluminum nitride (AlN), or a multilayer piezoelectric substrate formed by stacking a piezoelectric material such as aluminum nitride or tantalum pentoxide ($Ta_2O_5$) on an oxide substrate such as lithium niobate ($LiNbO_3$), lithium tantalate ($LiTaO_3$), lead zirconate titanate (PZT), lithium tetraborate ($Li_2B_4O_7$) or langasite ($La_3Ga_5SiO_{14}$) or on a glass substrate, or piezoelectric ceramics or the like can be used. Also, a vibrating element can be formed using other materials than piezoelectric materials. For example, a vibrating element can be formed using a silicon semiconductor material or the like. Moreover, the vibration (driving) method for the vibrating element is not limited to piezoelectric drive. The configurations of the invention and the advantages thereof can be achieved with an electrostatic-driven vibrating element using an electrostatic force or a Lorentz-driven vibrating element using a magnetic force, as well as a piezoelectric-driven vibrating element using a piezoelectric substrate. Also, in the specification and drawings, a term that is described together with a different term having a broader meaning or the same meaning at least once can be replaced by that different term. Moreover, the configurations and operations of the gyro sensor 11, the vibrating elements 15, 15a to 15e, the smartphone 101, the camera 103, the automobile 106 and the like are not limited to the description of the embodiments and various modifications can be made.

The entire disclosure of Japanese Patent Application No: 2012-74794, filed Mar. 28, 2012 is expressly incorporated by reference herein.

What is claimed is:

1. A vibrating element comprising:
   a base;
   a first vibrating arm extending along a first direction from the base;
   a second vibrating arm extending along a second direction opposite to the first direction, from the base;
   a first suspension arm extending along the first direction from a fixed portion and connected to a first connecting part of the base so that the base, the first suspension arm and the fixed portion surround the first vibrating arm; and
   a pair of second suspension arms extending along the first direction from the fixed portion, on both sides of the first suspension arm, and connected to a second connecting part of the base so that base, the pair of second suspension arms and the fixed portion surround the first vibrating arm and the first suspension arm;
   wherein one of the first vibrating arm and the second vibrating arm is a vibrating arm for driving, and the other is a vibrating arm for detection.

2. The vibrating element according to claim 1, wherein the first vibrating arm is located between the base and the fixed portion in the first direction, and
   the second connecting part is located closer to the second vibrating arm than the first connecting part in the second direction.

3. The vibrating element according to claim 1, comprising:
   a first wire which is arranged in the first suspension arm and connected to a first electrode provided on the first vibrating arm; and
   a second wire which is arranged in the second suspension arms and connected to a second electrode provided on the second vibrating arm.

4. The vibrating element according to claim 3, wherein the fixed portion includes:
   a first fixed piece on which a first electrically conductive terminal connected to the first wire is provided and which is connected to the first suspension arm; and
   a pair of second fixed pieces on which a second electrically conductive terminal connected to the second wire is provided and which extend from the first fixed piece, on both sides of the first suspension arm, and are connected to the respective second suspension arms.

5. The vibrating element according to claim 4, wherein a width of each of the second fixed pieces is larger than a width of each of the second suspension arms.

6. The vibrating element according to claim 4, wherein a conductive terminal for grounding is arranged between the first electrically conductive terminal and the second electrically conductive terminal.

7. The vibrating element according to claim 1, wherein the first suspension arm is a pair of first suspension arms, the first connecting part is a pair of first connecting parts, and
   each of the first suspension arms is connected to each of the first connecting parts, respectively.

8. The vibrating element according to claim 1, wherein at least one of the first suspension arm and the second suspension arms has at least two flexure parts between the fixed portion and the base.

9. A gyro sensor comprising:
a vibrating element that includes:
  a base;
  a first vibrating arm extending along a first direction from the base;
  a second vibrating arm extending along a second direction opposite to the first direction, from the base;
  a first suspension arm extending along the first direction from a fixed portion and connected to a first connecting part of the base so that the base, the first suspension arm and the fixed portion surround the first vibrating arm; and
  a pair of second suspension arms extending along the first direction from the fixed portion, on both sides of the first suspension arm, and connected to a second connecting part of the base so that base, the pair of second suspension arms and the fixed portion surround the first vibrating arm and the first suspension arm;
an IC that drives the vibrating element; and
a container that houses the vibrating element and the IC, wherein
one of the first vibrating arm and the second vibrating arm is a vibrating arm for driving, and the other is a vibrating arm for detection.

10. A vibrating element comprising:
a base;
a pair of first vibrating arms extending along a first direction from the base, first edges of the pair of first vibrating arms connecting the base;
a second vibrating arm extending along a second direction opposite to the first direction, from the base;
a first suspension arm extending along the first direction from a fixed portion and connected to a first connecting part of the base, the first connection part being located a center between the first edges of the pair of first vibrating arms so that the first suspension arm being parallel to the pair of first vibrating arms; and
a pair of second suspension arms extending along the first direction from the fixed portion, on both sides of the pair of first vibrating arms, and connected to a second connecting part of the base so that base, the pair of second suspension arms and the fixed portion surround the pair of first vibrating arms and the first suspension arm;
wherein one of the pair of first vibrating arms and the second vibrating arm is a vibrating arm for driving, and the other is a vibrating arm for detection.

* * * * *